United States Patent
Steiner

(10) Patent No.: US 7,859,443 B2
(45) Date of Patent: Dec. 28, 2010

(54) SIGMA-DELTA CONVERTER AND SIGNAL PROCESSING METHOD

(75) Inventor: Matthias Steiner, Seiersberg (AT)

(73) Assignee: austriamicrosystems AG, Unterpremstätten (AT)

( * ) Notice: Subject to any disclaimer, the term of this patent is extended or adjusted under 35 U.S.C. 154(b) by 23 days.

(21) Appl. No.: 12/473,247

(22) Filed: May 27, 2009

(65) Prior Publication Data

US 2009/0295615 A1 Dec. 3, 2009

(30) Foreign Application Priority Data

May 28, 2008 (DE) .................. 10 2008 024 897

(51) Int. Cl.
*H03M 3/00* (2006.01)

(52) U.S. Cl. ..................... 341/143; 375/246

(58) Field of Classification Search ............... 341/143
See application file for complete search history.

(56) References Cited

U.S. PATENT DOCUMENTS

| | | | |
|---|---|---|---|
| 6,229,466 B1 * | 5/2001 | Gattani ................ | 341/120 |
| 6,260,053 B1 * | 7/2001 | Maulik et al. ............. | 708/313 |
| 6,400,297 B1 * | 6/2002 | Tucker ................ | 341/143 |
| 6,744,392 B2 * | 6/2004 | Melanson ............... | 341/143 |
| 6,795,002 B2 * | 9/2004 | Gupta ................ | 341/143 |
| 7,084,797 B2 * | 8/2006 | Yokoyama et al. ........ | 341/143 |
| 7,460,046 B2 * | 12/2008 | Di Giandomenico et al. ................ | 341/143 |

FOREIGN PATENT DOCUMENTS

| | | |
|---|---|---|
| DE | 196 40 072 | 4/1998 |
| EP | 0 948 139 | 4/1998 |
| EP | 1 394 950 | 12/2002 |

* cited by examiner

*Primary Examiner*—Lam T Mai
(74) *Attorney, Agent, or Firm*—Cohen Pontani Lieberman & Pavane LLP

(57) ABSTRACT

A sigma-delta converter comprises a sigma-delta modulator (SDM) with a signal processing block (SP) and a quantizer (QNT), as well as a stage adaptation element (DCC). The signal processing block (SP) is designed for deriving a modulated signal (MOD) in dependence on the respective signals at a signal input (SIN) and at a feedback input (FIN). The quantizer (QNT) comprises a quantization input (QIN) that is coupled to the signal output (SOT) and a quantization output (QOT) that is coupled to the feedback input (FIN), wherein the quantizer is designed for deriving a first quantized signal (Q1) from the modulated signal (MOD) by quantization with a first number of stages and for outputting this first quantized signal at the quantization output (QOT). The stage adaptation element is coupled to the quantization output (QOT) on the input side and to a converter output (COT) on the output side and is designed for deriving a second quantized signal (Q2) with a second number of stages that is smaller than the first number of stages from the first quantized signal (Q1).

15 Claims, 3 Drawing Sheets

SIGMA-DELTA CONVERTER AND SIGNAL PROCESSING METHOD

RELATED APPLICATIONS

This application claims the priority of German application No. 10 2008 024 897.5 filed May 28, 2008, the entire content of which is hereby incorporated by reference.

FIELD OF THE INVENTION

The invention pertains to a sigma-delta converter and to a signal processing method, particularly for a signal conversion by means of sigma-delta modulation. The invention furthermore pertains to the utilization of the sigma-delta converter.

BACKGROUND OF THE INVENTION

Sigma-delta converters are used, for example, for converting an analog signal into a digital data stream. For this purpose, the input signal of the sigma-delta converter is modulated in accordance with the customary sigma-delta modulation principle by means of one or more modulation stages and is fed to a quantizer. In the quantizer, the modulated signal is sampled with two or more quantization stages and quantized such that a quantized data stream with a certain word size is created, wherein this word size depends on the number of quantization stages. Consequently, a binary bit stream is created if only two quantization stages are provided.

In conventional sigma-delta converters, the modulated signal or the modulator can become unstable if the input signal level exceeds certain limits. Consequently, the sigma-delta converter cannot be used in input signal ranges that could theoretically be represented by the digital quantized signal. For example, a sigma-delta converter with a sigma-delta modulator of the fourth order and a one bit output would be unable to process input signals that would produce a modulated signal with a modulation rate greater than ±70%. Expressed in digital terms, the modulation rate may, for example, result as the ratio of the numerical difference between bits with high signal level and bits with low signal level referred to the overall number of bits observed. The closer the input signal level lies to a theoretical positive or negative limit of the input signal range, the higher the amount of the corresponding theoretical modulation rate becomes.

In order to solve these instability problems, it is possible, for example, to adapt the input amplitude of the signal to be converted in such a way that the limited input signal range is no longer relevant and this input signal adaptation is compensated by once again raising the level of the digital quantized signal, for example, by an amplification factor of a downstream digital filter.

However, if such a digital filter cannot be influenced, for example, because the amplification factor is fixed, conventional sigma-delta converters do not make it possible to utilize a theoretically possible input signal range and to simultaneously ensure the stability of the sigma-delta converter.

SUMMARY OF THE INVENTION

One object of the present invention is to provide a sigma-delta converter and a signal processing method that make it possible to also convert a signal with improved stability at high input signal levels.

One embodiment of a sigma-delta converter comprises a sigma-delta modulator with a signal processing block and a quantizer, as well as a stage adaptation element. The signal processing block features a signal input, a feedback input and a signal output and is designed for deriving a modulated signal in dependence on the respective signals at the signal input and at the feedback input. The quantizer features a quantization input that is coupled to the signal output and a quantization output that is coupled to the feedback input, wherein the quantizer is designed for deriving a first quantized signal from the modulated signal by means of quantization with a first number of stages and for outputting this first quantized signal at the quantization output. The stage adaptation element is coupled to the quantization output on the input side and to a converter output on the output side. It is designed for deriving a second quantized signal with a second number of stages that is smaller than the first number of stages from the first quantized signal.

The stability criteria of a sigma-delta modulator usually become less strict as the number of quantization stages at the output of a quantizer increases. In other words, it would be possible to process signals with comparatively higher input levels, i.e., within a broader input signal range, by means of a sigma-delta modulator that has a greater number of quantization stages without rendering the system unstable. The stage adaptation element reduces the number of quantization stages of the modulated and quantized signals without affecting the stability of the sigma-delta modulator. Consequently, it can be ensured that a sigma-delta converter according to the described embodiment also operates with improved stability at higher input signal levels if the number of quantization stages in the output signal is predefined.

The first number of stages or quantization stages results, for example, from a first word size and the second number of stages results from a second word size that is smaller than the first word size. The respective number of quantization stages may, for example, be defined as the power of two of the respective word sizes of the first and the second quantized signal.

The signal processing block usually has a predefined transfer function, based on which the modulated signal is derived from the signals applied to the signal input and to the feedback input. For example, this transfer function is predefined, among other things, by the structure of the sigma-delta modulator and accordingly used system parameters. The transfer function may result from the properties of modulation stages between the input and the signal output.

The second quantized signal can be derived from the first quantized signal in the stage adaptation element in different ways. For example, the second quantized signal can be derived by clipping the first quantized signal. For example, quantization stages in the first quantized signal that are greater than the greatest stage possible in the second quantized signal or smaller than the smallest stage possible in the second quantized signal are clipped in this case. The clipped quantization stages are accordingly mapped, for example, on the respectively greatest and smallest quantization stage possible in the second quantized signal.

In another embodiment, the second quantized signal can be derived from the first quantized signal by compressing the first number of stages. For example, the quantization information in the first quantized signal is evaluated and used for realizing respective stages in the second quantized signal in this case.

For example, instances in which the permissible quantization stages are exceeded or not reached in the second quantized signal are counted and the counting result is used for deriving the second quantized signal. Less information contained in the first quantized signal therefore is lost during the compression of the first number of stages such that the second quantized signal has a superior signal quality.

In one embodiment, the first quantized signal has four stages and the second quantized signal has a first and a second stage. For example, the first quantized signal therefore has a word size of two bits and the second quantized signal has a word size of one bit. The second quantized signal therefore can also be referred to as bit stream. Two of the four stages of the first quantized signal preferably can be assigned to the first and the second stage of the second quantized signal.

In one embodiment, the stage adaptation element can be specially designed for this instance. For example, a counter is incremented when a stage of the first quantized signal is greater than a stage of the second quantized signal and the counter is decremented if the stage of the first quantized signal is smaller than the stage of the second quantized signal, wherein the counter is left unchanged if the stages of the first and the second quantized signal are equal. The counter can be evaluated in the stage adaptation element in such a way that the first stage is output when the counter is greater than a reference value, the second stage is output when the counter is smaller than a reference value and the stage of the first quantized signal is output if the counter is equal to the reference value. For example, the reference value may be zero for a quantization range that is symmetrically distributed around the zero point.

In one embodiment of a signal processing method, a modulated signal is derived by means of sigma-delta modulation in dependence on an input signal and a feedback signal. A first quantized signal is derived from the first modulated signal by means of quantization with a first number of stages. The feedback signal is derived from the first quantized signal. A second quantized signal is also derived from the first quantized signal and has a second number of stages that is smaller than the first number of stages.

The described method consequently makes it possible to derive a first quantized signal with a higher number of quantization stages from a preferably analog input signal, wherein the stability requirements during the sigma-delta modulation are lowered due to the higher number of quantization stages. In order to obtain the desired output signal in the form of a second quantized signal with a lower number of quantization stages, the second quantized signal is derived with the lower second number of stages or smaller second word size by clipping or compressing the first number of stages.

BRIEF DESCRIPTION OF THE DRAWINGS

Several embodiments of the invention are described in greater detail below with reference to the figures. Elements that have identical functions or produce identical effects are identified by the same reference symbols. The description of functionally identical elements is not repeated for each of the following figures.

Shown are.

DETAILED DESCRIPTION OF THE DRAWINGS

Figure 1:
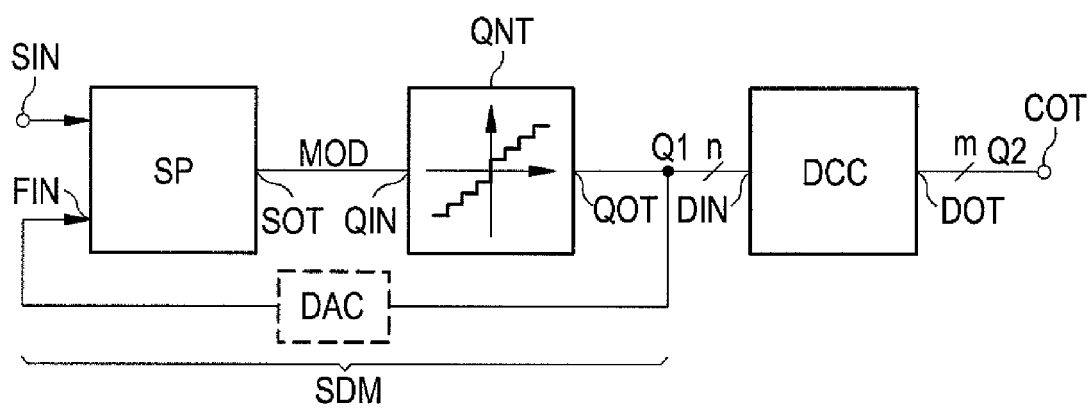
FIG. 1, a first embodiment of a sigma-delta converter.

FIG. 1 shows an embodiment of a sigma-delta converter with a sigma-delta modulator SDM and a stage adaptation element DCC. The sigma-delta modulator SDM comprises a signal processing block SP with a signal input SIN, a feedback input FIN and a signal output SOT. A quantizer QNT is arranged downstream of the signal processing block SP and has a quantization input QIN that is coupled to the signal output SOT. A quantization output QOT of the quantizer QNT is coupled to the feedback input FIN. An input DIN of the stage adaptation element DCC is connected to the quantization output QOT and designed for receiving a data word or a quantized signal Q1 with a first word size n from the quantizer QNT. An output DOT of the stage adaptation element DCC is connected to a converter output COT of the sigma-delta converter and designed for outputting another data word or a second quantized signal Q2 with a second word size of m bits.

The signal processing block SP has, for example, a transfer function according to the customary sigma-delta principle that can be mapped, for example, as function H(z) in the z-plane or as function H(s) in the Laplace-plane. In this case, the transfer function may be of any order, but preferably is of the second, third, fourth or higher order. The transfer function usually also contains recursive portions due to the feedback of the output signal of the sigma-delta modulator SDM at the quantization output QOT to the feedback input FIN. Consequently, a modulated signal MOD is derived by means of the signal processing block SP from the input signal at the signal input SIN and the feedback signal at the feedback input FIN, wherein this modulated signal is subsequently fed to the quantizer QNT. The input signal, the feedback signal and the modulated signal MOD preferably consist of signals that are continuous in time and/or continuous in value.

The modulated signal MOD is quantized over several quantization stages in the quantizer QNT. The number of stages or quantization stages results from the first word size n. The first number of stages usually results from the power of two of the first word size n. However, this is not absolutely imperative such that, for example, theoretically possible quantization stages are not used. Stated more specifically, based on a binary representation of a signal, a certain number of stages (e.g., 2, 4, 8, 16, . . . ) could be theoretically represented by the quantized signal, but not the full range is actually used. Thus, use of 10 stages instead of 16 would nevertheless need a 4-bit representation. This could save comparators, depending on the technical implementation. During the feedback of the first quantized signal Q1 that is produced due to the quantization in the quantizer QNT, this signal is usually converted into the analog feedback signal by means of an optional digital/analog converter DAC.

In the stage adaptation element DCC, a second quantized signal Q2 with a second number of stages or quantization stages that is smaller than the first number of stages is derived from the first quantized signal Q1. Accordingly, the second word size m that defines the second number of stages is smaller than the first word size n.

The described sigma-delta converter makes it possible to carry out a sigma-delta modulation of an input signal with a higher number of quantization stages than that required or permitted at the converter output. This makes it possible to utilize the improved properties of a sigma-delta modulator achieved due to the higher number of quantization stages. The reduction of the quantization stages in the stage adaptation element DCC makes it possible to adapt the output signal of the sigma-delta converter in such a way that it conforms to certain specifications with respect to the second number of quantization stages or the second word size m. For example, the stability characteristics of the sigma-delta modulator SDM are improved with a higher number of quantization stages, particularly at high input signal levels.

The second quantized signal Q2 can be derived from the first quantized signal Q1, for example, by means of clipping (see below for discussion related to FIGS. 3A and 3B) or compressing (see below for discussion related to FIG. 4). In another embodiment, the second quantized signal Q2 can also be derived by means of a digital sigma-delta modulator.

Figure 2:
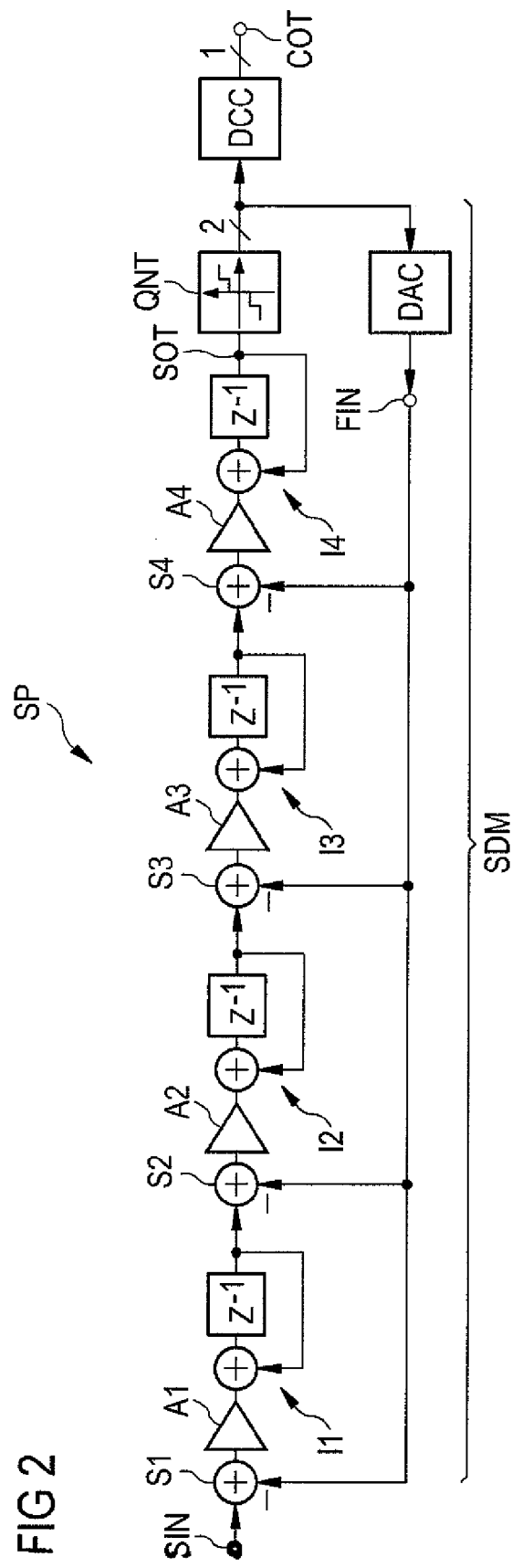
FIG. 2, a second embodiment of a sigma-delta converter.

FIG. 2 shows another embodiment of a sigma-delta converter with a four-stage signal processing block SP. Each of the stages comprises a summation element S1, S2, S3, S4, the input of which receives the input signal or an output signal of a preceding stage. The feedback signal at the feedback input FIN is also fed to the respective summation elements S1, S2, S3, S4, namely in negatively signed form. Furthermore, the modulator stages respectively feature a weighting element A1, A2, A3, A4 with corresponding weighting factors and an integrator element 11, 12, 13, 14. The output of the last modulator stage forms the signal output SOT that is coupled to the input of the quantizer QNT.

In this embodiment, the quantizer QNT is designed for a word size of two bits and accordingly has a first number of quantization stages that amounts to four. The output side of the quantizer QNT is coupled to the feedback input FIN by means of a digital/analog converter DAC of corresponding word size. In this embodiment, the stage adaptation element DCC is designed for converting the four quantization stages of the first quantized signal Q1 that correspond to the first word size of two into a second quantized signal Q2 with two quantization stages that correspond to a word size of one.

Figure 3A:
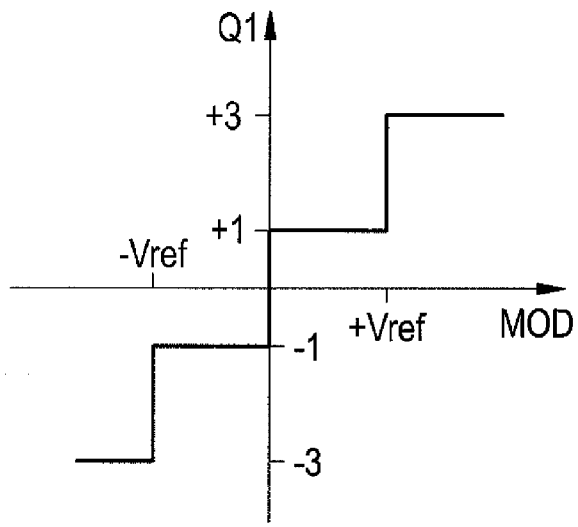
FIGS. 3A and 3B, exemplary signal diagrams of quantized signals.

FIG. 3A shows an exemplary signal diagram for input and output signals of a quantizer QNT with four quantization stages that could correspond to the quantization characteristics of the quantizer QNT shown in FIG. 2. For a modulated signal MOD with a value smaller than a negative reference value −Vref, for example, −3 is quantized as value while −1 is quantized for an input signal that lies between the negative reference value −Vref and zero. Accordingly and preferably symmetrically thereto, a quantized value of +1 is obtained for an input signal between zero and a positive reference value +Vref, wherein the highest quantization stage +3 results for input values greater than the positive reference value Vref. In other embodiments, the type of quantization and, in particular, the respective values of the quantization stages may be chosen differently.

Figure 3B:
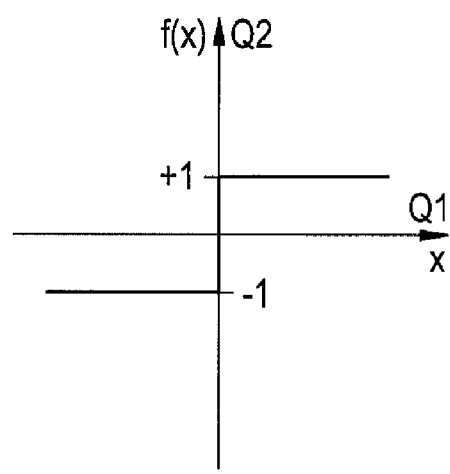

FIG. 3B shows an exemplary signal diagram for a quantization principle with two quantization stages, in which a quantization value of +1 is obtained for values greater than zero in dependence on an input signal x and a quantization value of −1 is obtained for values lower than zero.

For example, the second quantized signal Q2 that corresponds to the quantization principle illustrated in FIG. 3B is derived from a quantized signal Q1 in accordance with the quantization principle illustrated in FIG. 3A in the stage adaptation element DCC, namely with reference to FIG. 2.

In one embodiment of the sigma-delta converter or the stage adaptation element, signal portions with the highest and lowest quantization stage of the first quantized signal Q1, i.e., the values +3 and −3, can be reduced to the possible quantization stages of the second quantized signal, i.e., +1 and −1, by means of clipping. In other words, the clipping can be realized in such a way that the quantization values +1, +3 from the four-stage quantized signal are mapped on the value +1 in the two-stage quantized signal while the stages −1 and −3 are jointly mapped on the value −1.

Figure 4:
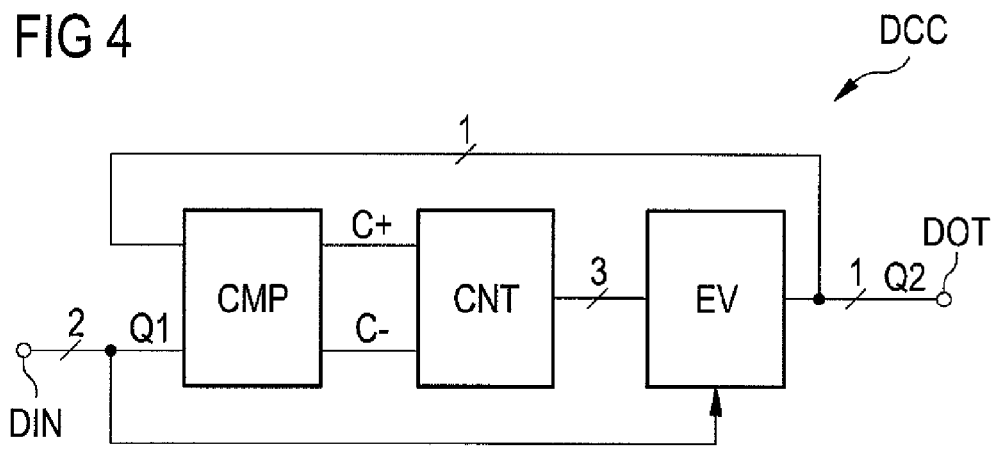
FIG. 4, an embodiment of a stage adaptation element.

FIG. 4 shows an alternative embodiment of a stage adaptation element DCC with a comparator CMP, a counter CNT and an evaluation block EV. The first quantized signal Q1 with a word size of two bits and the second quantized signal Q2 with a word size of one bit are fed to the input side of the comparator CMP.

The current quantization stages of the first and the second quantized signal Q1, Q2 are compared with one another in the comparator CMP. If the stage of the first quantized signal Q1 is greater than the stage of the second quantized signal Q2, the counter CNT is incremented by means of a corresponding incrementing signal C+. If the stage of the first quantized signal Q1 is smaller than the stage of the second quantized signal Q2, the counter CNT is decremented by means of a corresponding decrementing signal C−. The counter CNT remains unchanged if both stages of the first and the second quantized signal Q1, Q2 are equal as may be the case, for example, for the instances +1 and −1. For example, neither an incrementing signal C+ nor a decrementing signal C− is output in this case. The counting result is output to the evaluation block EV with a word size of 3 in this embodiment. This means that, for example, a counting range from −3 to +3 is used in the counter CNT.

The evaluation block EV is designed for outputting the second quantized signal Q2 in dependence on the counting result of the counter CNT. A first stage such as, for example, +1 is output if the counter is greater than a reference value such as, for example, 0. The second stage such as, for example, −1 is output if the counter is smaller than the reference value. If the counter is equal to the reference value, the stage of the first quantized signal Q1 is output. The evaluation block EV is coupled to the input DIN for this purpose. The stage of the first quantized signal Q1 can only be output if the first quantized signal Q1 has a quantization value of +1 or −1, but not for the quantization values +3 and −3 because the counting result would not be equal to 0 in the latter instance.

In the described method for deriving the second quantized signal from the first quantized signal in accordance with FIG. 4, the quantization stages on the input side consequently are compressed to the quantization stages on the output side. The compression can be carried out with discrete elements or realized by programming a microcontroller or signal processor accordingly.

Figure 5:
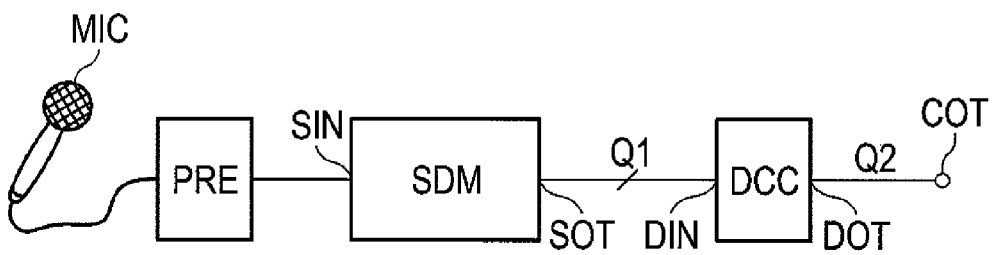
FIG. 5, an embodiment of a system for acquiring a signal with a sigma-delta converter.

FIG. 5 shows an embodiment of a system for acquiring an audio signal that consists, for example, of a microphone signal.

The system comprises a sigma-delta converter according to one of the above-described embodiments with a sigma-delta modulator SDM and a stage adaptation element DCC. Furthermore, an analog pre-processing device PRE is provided, wherein a microphone MIC is connected to the input side of the analog pre-processing device and the output side thereof is coupled to the signal input SIN of the sigma-delta modulator SDM.

The pre-processing device PRE comprises, for example, a microphone pre-amplifier that adapts the level of the microphone signal being output by the microphone MIC with respect to a desired input level of the sigma-delta modulator SDM. Consequently, the second quantized signal Q2 can be tapped at the converter output COT in the form of a sigma-delta-modulated bit stream that represents the microphone signal being applied to the input side. Possible impairments of the noise characteristics of the sigma-delta modulator SDM caused by the adaptation of the quantization stages in the stage adaptation element DCC can be neglected for this application. The sigma-delta converter used also remains stable at high microphone levels that result from the recording of loud noises. The noise characteristics can be considered to be of secondary importance for the signal quality, particularly with respect to such loud noises.

It should be noted that the term deriving different signals that was used in the description of the embodiments should not be interpreted in the sense of a mathematical differentiation. On the contrary, the term deriving should be interpreted in the sense of deducing or making available a signal in dependence on one or more input variables.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A sigma-delta converter comprising:
    a sigma-delta modulator with a signal processing block that comprises a signal input, a feedback input and a signal output and is configured to derive a modulated signal in dependence on the respective signals at the signal input and at the feedback input, and with a quantizer that comprises a quantization input that is coupled to the signal output and a quantization output that is coupled to the feedback input, wherein the quantizer is configured to derive a first quantized signal from the modulated signal by means of quantization with a first number of stages and to output this first quantized signal at the quantization output; and
    a stage adaptation element that is coupled to the quantization output on the input side and to a converter output on the output side and is configured to derive a second quantized signal with a second number of stages that is smaller than the first number of stages from the first quantized signal.

2. The sigma-delta converter according to claim 1, wherein the first number of stages is related to a first word size and the second number of stages is related to a second word size that is smaller than the first word size.

3. The sigma-delta converter according to claim 1, wherein the signal processing block is configured to derive the modulated signal with a predefined transfer function.

4. The sigma-delta converter according to claim 1, wherein the stage adaptation element is configured to derive the second quantized signal by clipping the first quantized signal.

5. The sigma-delta converter according to claim 1, wherein the stage adaptation element is configured to derive the second quantized signal by compressing the first number of stages of the first quantized signal.

6. The sigma-delta converter according to claim 1, wherein the first quantized signal has four stages and the second quantized signal has a first and a second stage.

7. The sigma-delta converter according to claim 6, wherein the stage adaptation element is configured
    to increment a counter if a stage of the first quantized signal is greater than a stage of the second quantized signal, to decrement the counter if the stage of the first quantized signal is smaller than the stage of the second quantized signal and to leave the counter unchanged if the stages of the first and the second quantized signal are equal; and
    to output the first stage if the counter is greater than a reference value, to output the second stage if the counter is smaller than the reference value and to output the stage of the first quantized signal (Q1) if the counter is equal to the reference value.

8. The sigma-delta converter according to claim 1, wherein the feedback input is coupled to the quantization output by a digital/analog converter.

9. A signal processing method comprising the steps of:
    deriving a modulated signal with sigma-delta modulation in dependence on an input signal and a feedback signal;
    deriving a first quantized signal from the modulated signal by quantization with a first number of stages;
    deriving the feedback signal from the first quantized signal; and
    deriving a second quantized signal from the first quantized signal with a second number of stages that is smaller than the first number of stages.

10. The method according to claim 9, wherein the first number of stages is related to a first word size and the second number of stages is related to a second word size that is smaller than the first word size.

11. The method according to claim 9, wherein the second quantized signal is derived by clipping the first quantized signal.

12. The method according to claim 9, wherein the second quantized signal is derived by compressing the first number of stages of the first quantized signal.

13. The method according to claim 9, wherein the first quantized signal has four stages and the second quantized signal has a first and a second stage.

14. The method according to claim 13, wherein the derivation of the second quantized signal comprises the steps of:
    incrementing a counter if a stage of the first quantized signal is greater than a stage of the second quantized signal, decrementing the counter if the stage of the first quantized signal is smaller than the stage of the second quantized signal, and leaving the counter unchanged if the stages of the first and the second quantized signal are equal; and
    outputting the first stage if the counter is greater than a reference value, outputting the second stage if the counter is smaller than the reference value, and outputting the stage of the first quantized signal if the counter is equal to the reference value.

15. A system for acquiring an audio signal comprising the sigma-delta converter according to claim 1.

* * * * *